(12) United States Patent
Lee

(10) Patent No.: US 7,129,532 B2
(45) Date of Patent: Oct. 31, 2006

(54) IMAGE SENSOR AND METHOD FOR FABRICATING THE SAME

(75) Inventor: Ju-Il Lee, Chungcheongbuk-do (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 11/073,074

(22) Filed: Mar. 4, 2005

(65) Prior Publication Data

US 2005/0208692 A1 Sep. 22, 2005

(30) Foreign Application Priority Data

Mar. 22, 2004 (KR) ...................... 10-2004-0019408

(51) Int. Cl.
*H01L 27/148* (2006.01)
(52) U.S. Cl. ................ 257/228; 257/447; 257/E27.132
(58) Field of Classification Search ................ 257/414, 257/429, 431, 432, 436, E31.075, E31.078, 257/E31.081, E31.084, E27.133, 59, 72, 257/213, 215, 222, 225, 228–234, 294, 428, 257/440, 441, 443, 447, E27.141, E27.148, 257/E27.15, E21.132, 27.13; 438/60, 75, 438/144, FOR. 213
See application file for complete search history.

(56) References Cited

U.S. PATENT DOCUMENTS

| 6,307,243 | B1 * | 10/2001 | Rhodes ........................ 257/432 |
| 6,632,700 | B1 * | 10/2003 | Fan et al. ...................... 438/70 |
| 2001/0010952 | A1 * | 8/2001 | Abramovich ................ 438/151 |

FOREIGN PATENT DOCUMENTS

KR 1020020014519 2/2002

\* cited by examiner

*Primary Examiner*—Brook Kebede
(74) *Attorney, Agent, or Firm*—Blakely Sokoloff Taylor & Zafman

(57) ABSTRACT

The present invention relates to an image sensor with a microlens and a method for fabricating the same with use of a bump formation process. A method for fabricating an image sensor includes the steps of: forming a passivation layer on a substrate structure provided with a photodiode and other various device elements; forming a microlens on a portion of the passivation layer; forming a microlens passivation layer for protecting the microlens from a subsequent bump formation process on the microlens; forming a pad open region by selectively etching the microlens passivation layer and the passivation layer; and forming a bump in the pad open region.

9 Claims, 7 Drawing Sheets

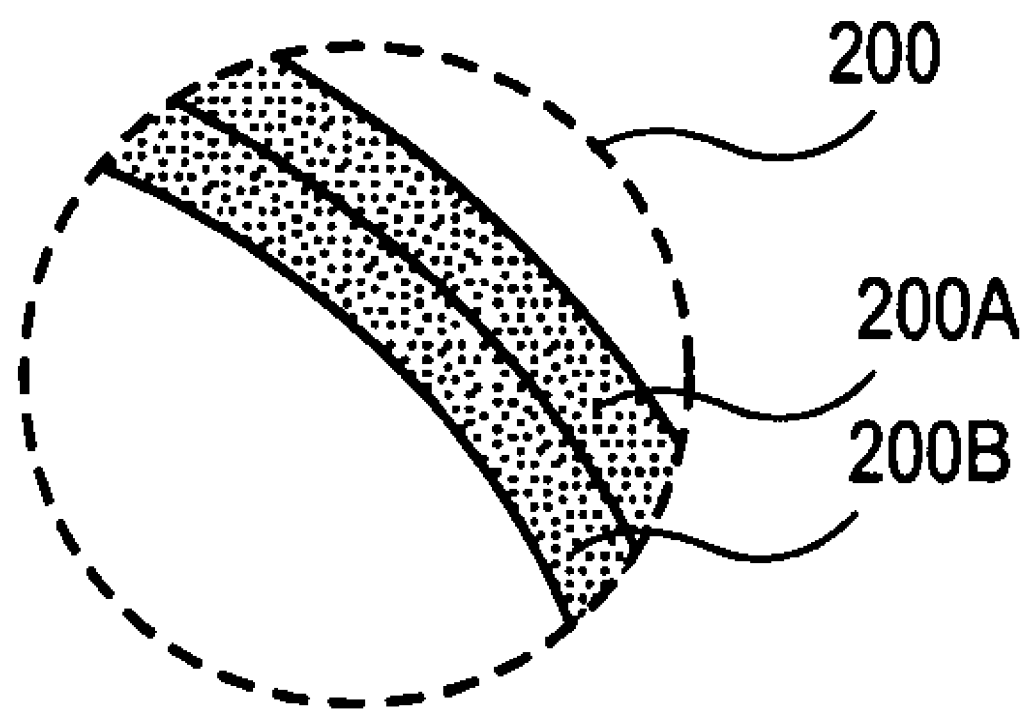

IMAGE SENSOR AND METHOD FOR FABRICATING THE SAME

FIELD OF THE INVENTION

The present invention relates to an image sensor and a method for fabricating the same; and, more particularly, to an image sensor and a method for fabricating the same with use of a bump formation process. The present invention can be applied to a complementary metal-oxide semiconductor (CMOS) image sensor and a charged coupled device (CCD) image sensor.

DESCRIPTION OF RELATED ARTS

As is well known, various technologies of a chip size package (CSP) are applied to a package technology of a semiconductor chip for an ultra small package, and instead of a bonding wire, a bump is formed on a pad of the chip for the CSP.

FIGS. 1A to 1E are cross-sectional views illustrating a conventional method for fabricating a complementary metal-oxide semiconductor (CMOS) image sensor provided with a bump.

Referring to FIG. 1A, a series of device elements of the CMOS image sensor including a photodiode (PD) 102, a field oxide layer (FOX) and an inter-layer insulation layer (ILD) is formed on a substrate 101 and then, a plurality of metal interconnection lines 103 are formed on the above substrate structure. A passivation layer 104 is formed on the above-obtained substrate structure including the metal interconnection lines 103. It is general that the passivation layer 104 is formed by stacking an oxide layer and a nitride layer.

In a region of a unit pixel where the photodiode (PD) 102 is formed, a first planarization layer 106 is formed on the passivation layer 104, and a color filter 107 is formed on a portion of the first planarization layer 106 corresponding to the photodiode region. A second planarization layer 108 is formed on the color filter 107 and then, a microlens 109 is formed thereon.

It is typical that the microlens 109 is formed by performing various steps. An organic photoresist is deposited and then, the organic photoresist is patterned by a photo exposure process and a developing process. Afterwards, the patterned photoresist is flowed by a thermal process, thereby forming the microlens 109.

Subsequently, a pad open region 105 is formed by opening a portion of one selected metal interconnection line 103 where a bump will be formed by etching the passivation layer 104 through the use of a mask. The pad open region 105 is formed out in a peripheral circuit region.

Next, FIGS. 1B to 1E illustrate a series of steps for forming a conventional bump on the pad open region 105.

Referring to FIG. 1B, as for a method for forming the bump, a titanium (Ti)-based adhesive layer 110 for improving adhesiveness and a gold seed layer 111 are sequentially deposited thereon. Referring to FIG. 1C, a photoresist pattern 112 is formed on the above resulting structure to expose the pad open region 105 where a gold bump will be formed later. Subsequently, as shown in FIG. 1D, the above mentioned gold bump 113 is formed only in a region where the photoresist pattern 112 is opened by employing a gold plating process. Afterwards, the photoresist pattern 112 is removed, and then, the gold seed layer 111 and the Ti-based adhesive layer 110 are etched by applying a blanket etch-back process, thereby removing the gold seed layer 111 and the Ti-based adhesive layer formed in a region where the gold bump 113 is not formed.

However, the above described bump formation process is performed while the microlens 109 is exposed. Therefore, the microlens 109 may be damaged or deformed during the bump formation process and furthermore, a black spot defect may be created due to adsorption of particles.

That is, the Ti-based adhesive layer 110 and the gold seed layer 111 are formed under the state that the microlens 109 is exposed and at this time, the microlens 109 made of the organic photoresist having a soft material property may be easily damaged by a sputtering method adopted to form the Ti-based adhesive layer 110 and the gold seed layer 111. A reference denotation 'A' appearing in FIGS. 1B to 1E expresses this damage caused by the sputtering method. Furthermore, when the Ti-based adhesive layer 110 and the gold seed layer 111 formed in regions other than the bump region are removed by the blanket etch-back process, the microlens 109 may also be damaged, and particles may be adsorbed thereto. This damage created by the etch-back process is denoted with a reference denotation 'B' in FIG. 1E. These absorbed particles are not easily removed by cleaning because the microlens is made of the organic material.

SUMMARY OF THE INVENTION

It is, therefore, an object of the present invention to provide an image sensor with a microlens and a method for fabricating the same capable of preventing the microlens from being damaged or deformed during a bump formation process and of easily removing particles generated during the bump formation process.

In accordance with one aspect of the present invention, there is provided an image sensor, including: a passivation layer formed on a substrate structure provided with a photodiode and other various device elements; a microlens formed on the passivation layer; a microlens passivation layer formed on the microlens and serving a role in protecting the microlens from a bump formation process; a pad open region formed by etching the microlens passivation layer and the passivation layer; and a bump formed in the pad open region.

In accordance with another aspect of the present invention, there is provided a method for fabricating an image sensor, including the steps of: forming a passivation layer on a substrate structure provided with a photodiode and other various device elements; forming a microlens on a portion of the passivation layer; forming a microlens passivation layer for protecting the microlens from a subsequent bump formation process on the microlens; forming a pad open region by selectively etching the microlens passivation layer and the passivation layer; and forming a bump in the pad open region.

BRIEF DESCRIPTION OF THE DRAWINGS

The above and other objects and features of the present invention will become better understood with respect to the following description of the preferred embodiments given in conjunction with the accompanying drawings, in which:

FIG. 2F is an exploded view of a microlens passivation layer in accordance with the present invention.

DETAILED DESCRIPTION OF THE INVENTION

Hereinafter, an image sensor and a method for fabricating the same in accordance with a preferred embodiment of the present invention will be explained in detail with reference to the accompanying drawings.

FIGS. 2A to 2E are cross-sectional views illustrating a method for fabricating an image sensor in accordance with a preferred embodiment of the present invention.

Figure 1A:
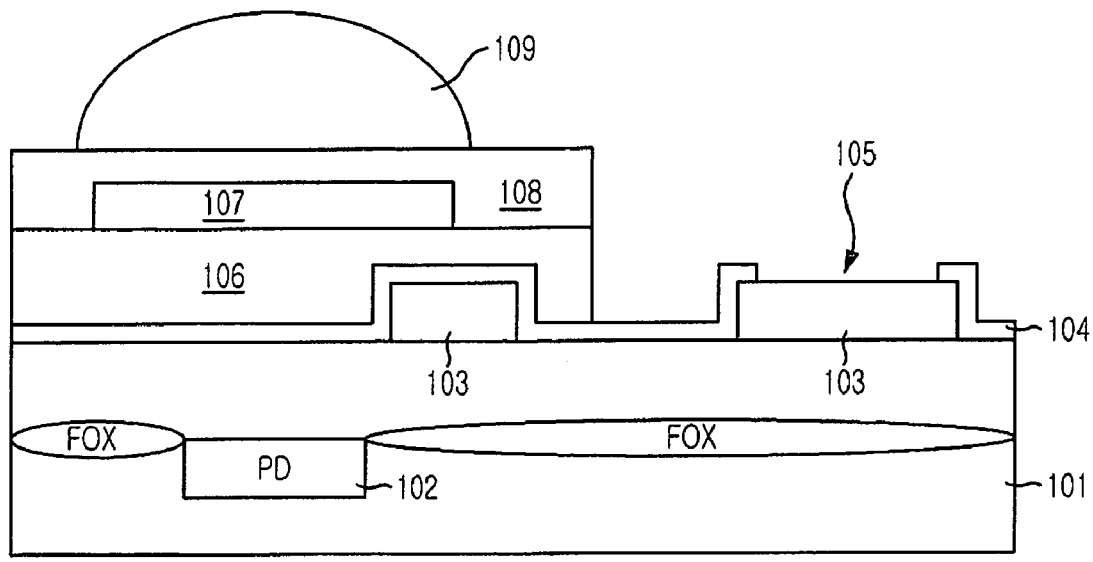
FIGS. 1A to 1E are cross-sectional views illustrating a conventional method for fabricating an image sensor.
Figure 1B:
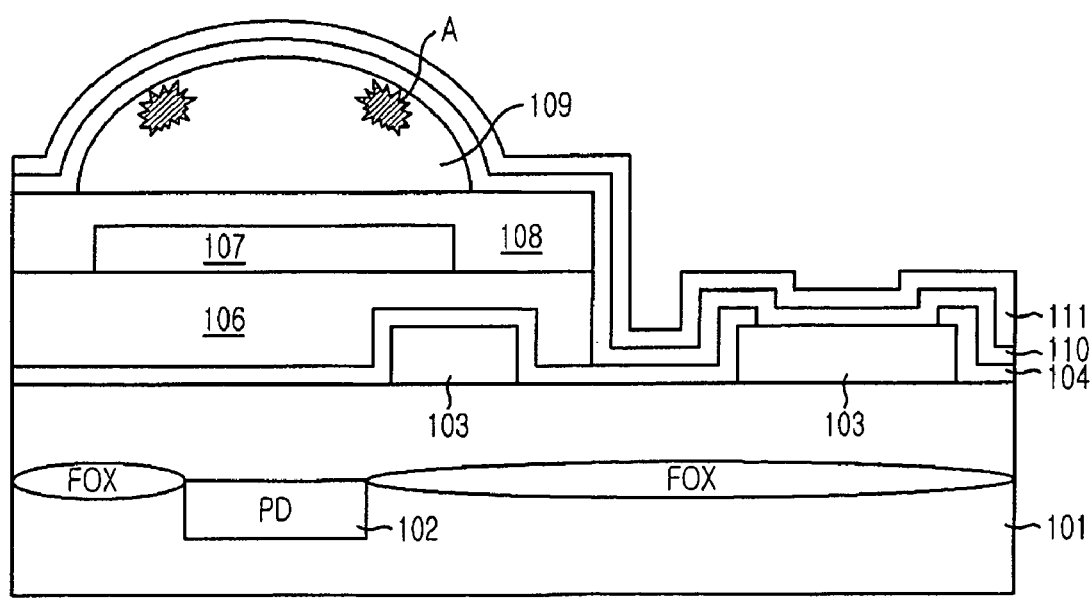
Figure 1C:
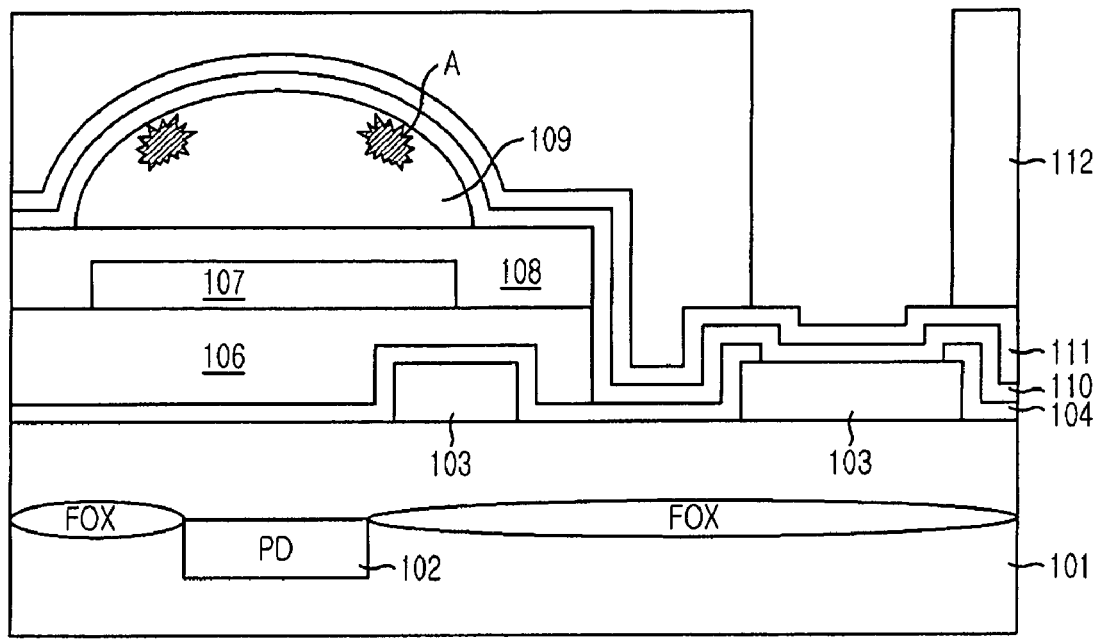
Figure 1D:
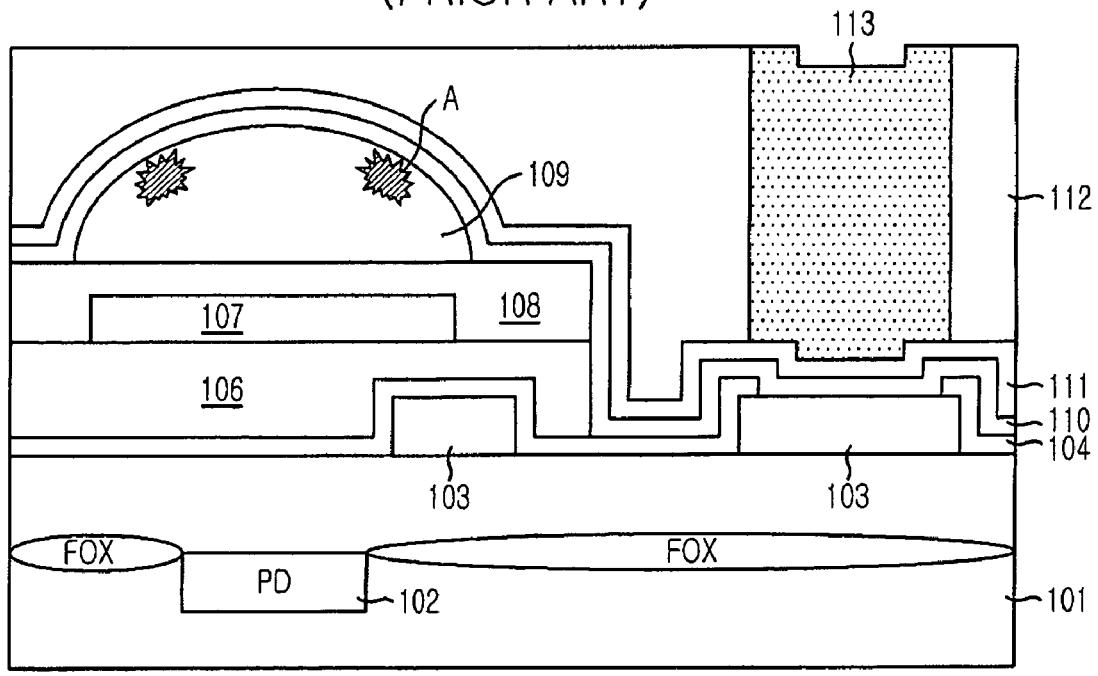
Figure 1E:
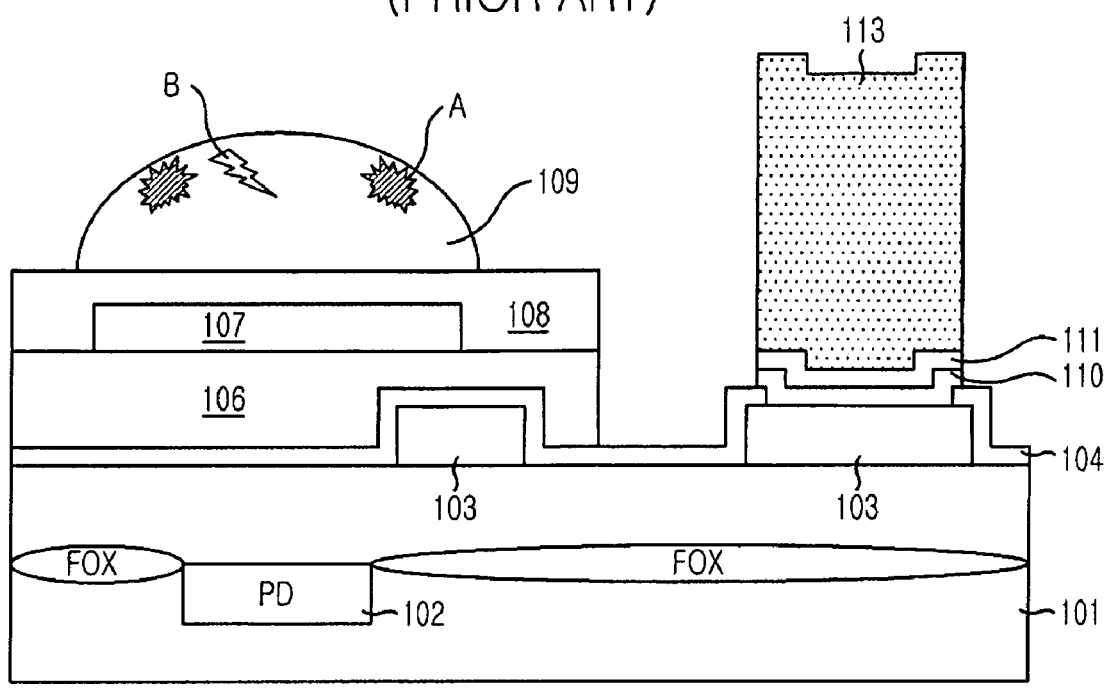
Figure 2A:
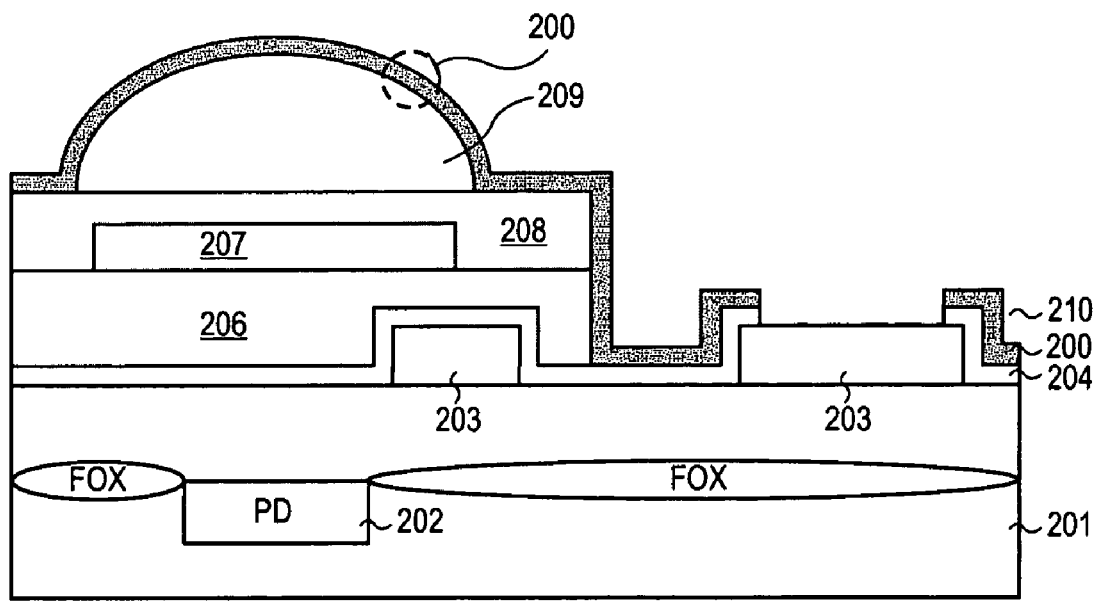
FIGS. 2A to 2E are cross-sectional views illustrating a method for fabricating an image sensor in accordance with the present invention.

Referring to FIG. 2A, a series of device elements of a complementary metal-oxide semiconductor (CMOS) image sensor including a photodiode (PD) 202, a field oxide layer (FOX) and an inter-layer insulation layer (ILD) is formed on a substrate 201 and then, a plurality of metal interconnection lines 203 are formed on the substrate 201. Afterwards, a passivation layer 204 is formed thereon. The passivation layer 204 is formed by stacking an oxide layer and a nitride layer.

Subsequently, in a region of a unit pixel where the photodiode 202 is formed, a first planarization layer 206 is formed on the passivation layer 204, and a color filter 207 is formed on a portion of the first planarization layer 206 corresponding to the photodiode region. A second planarization layer 208 is formed on the color filter 207 and then, a microlens 209 is formed thereon.

It is typical that the microlens 209 is formed by performing various steps. An organic photoresist is deposited and then, the organic photoresist is patterned by a photo exposure process and a developing process. Afterwards, the patterned photoresist is flowed by a thermal process, thereby forming the microlens 209.

Subsequently, a microlens passivation layer 200 is formed on the above resulting substrate structure. At this time, the microlens passivation layer 200 has a thickness ranging from approximately 100 Å to approximately 10,000 Å. Also, the microlens passivation layer 200 is formed with a material having an excellent light transmittance, and capable of being formed by a low temperature process and allowing the adsorbed particles to be easily removed. In accordance with the present embodiment, an oxide layer is used for such a characteristic material for forming the microlens passivation layer 200. The oxide layer can be formed at a temperature ranging from approximately 100° C. to approximately 200° C. and has an excellent light transmittance. The oxide layer is also an inorganic matter and thus, the adsorbed particles can be easily removed through a cleaning process during a subsequent bump formation process.

Subsequently, the microlens passivation layer 200 and the passivation layer 204 are etched by performing an etching process with use of a mask. From this etching process, a portion of the selected metal interconnection line 203 where a bump will be formed is opened, thereby forming a pad open region 205.

Referring to FIGS. 2B to 2E, the aforementioned bump is formed in the pad open region 205 by a typical method.

Figure 2B:
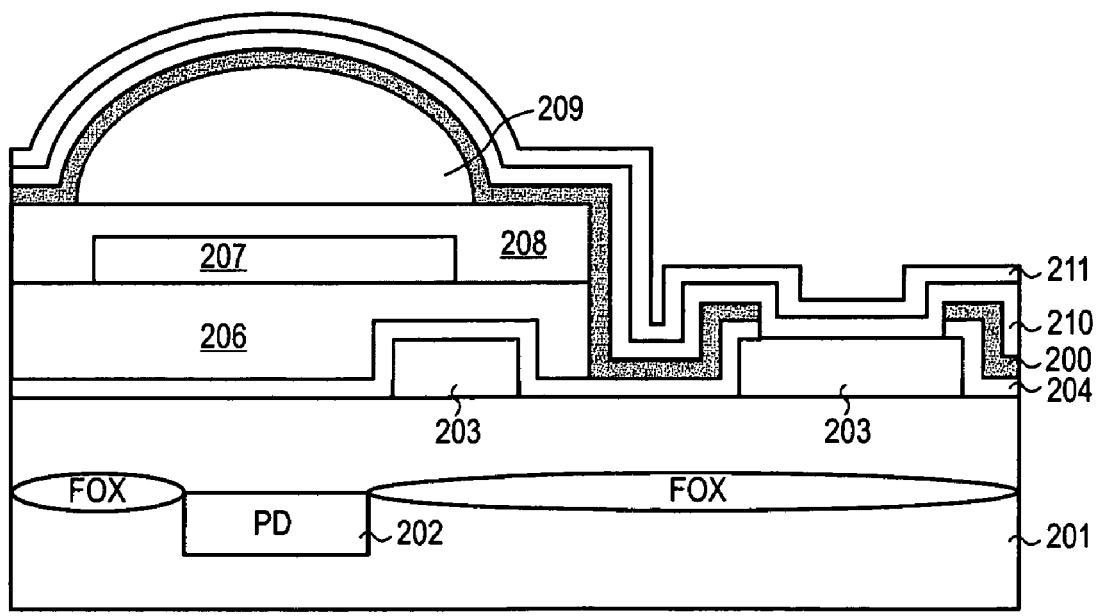

As for a detailed explanation on the above mentioned method for forming the bump, referring to FIG. 2B, a titanium (Ti)-based adhesive layer 210 for improving adhesiveness and a gold seed layer 211 are sequentially deposited on an entire surface of the substrate structure shown in FIG. 2A.

Figure 2C:
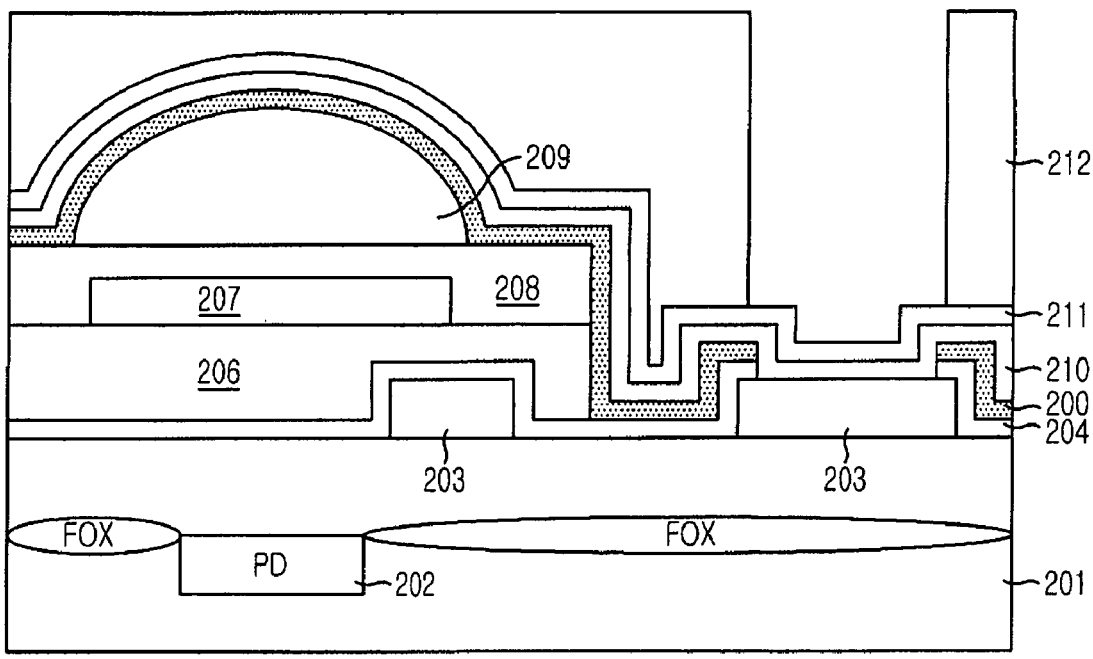

Referring to FIG. 2C, a photoresist pattern 212 is formed such to expose the pad open region 205 in which a gold bump will be formed later.

Figure 2D:
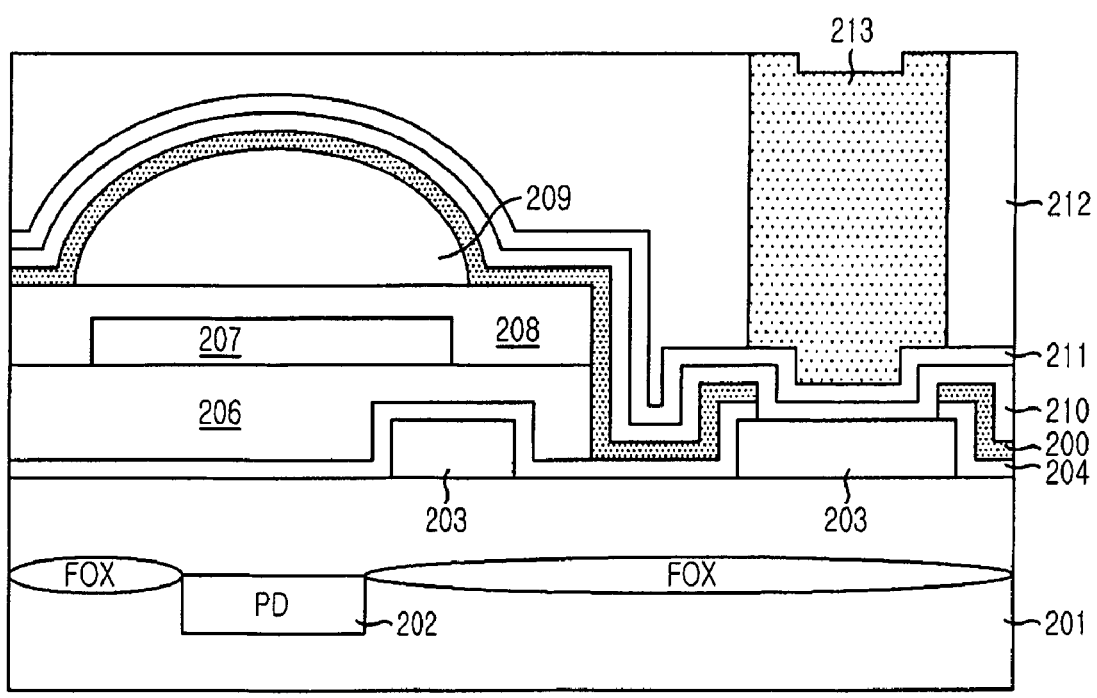

Referring to FIG. 2D, the gold bump 213 is formed only in a region where the photoresist pattern 212 is opened.

Figure 2E:
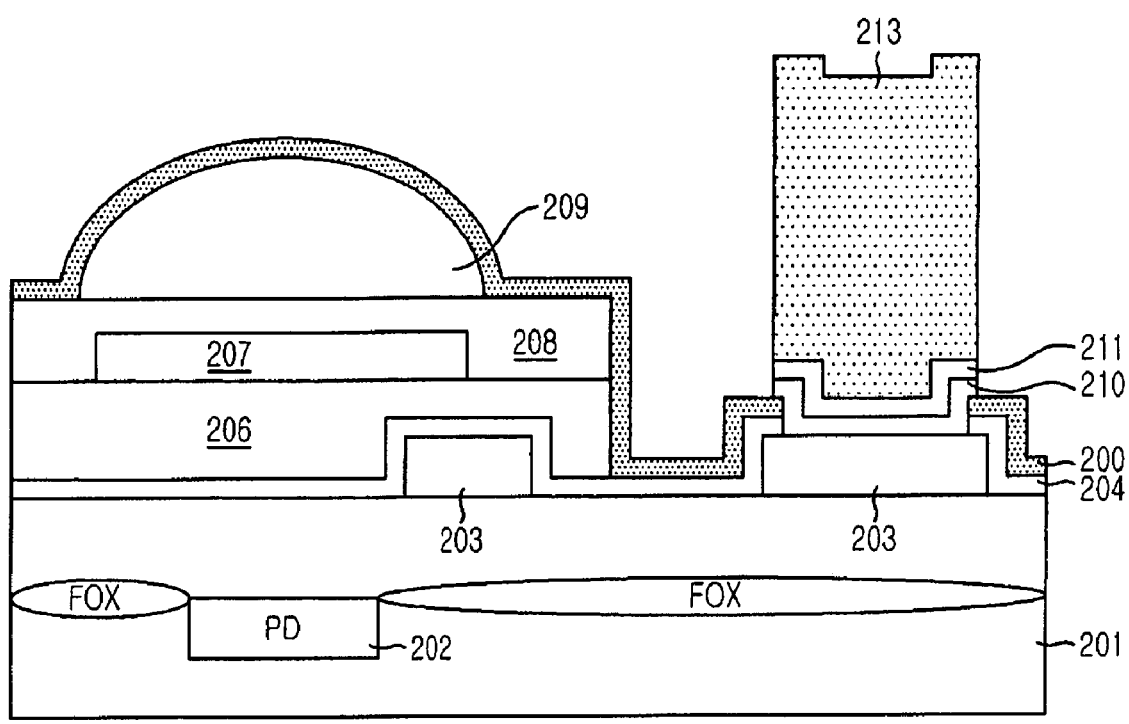

Subsequently, as shown in FIG. 2E, the photoresist pattern 212 is removed and then, the gold seed layer 211 and the Ti-based adhesive layer 210 are etched by employing the blanket etch-back process, thereby removing the gold seed layer 211 and the Ti-based adhesive layer 210 formed in regions other than a region where the gold bump 213 is formed.

Afterwards, the particles adsorbed on the microlens passivation layer 200 are removed by performing a cleaning process as occasion demands.

In accordance with the present invention, the adhesive layer based on Ti and the seed layer based on gold are formed by a sputtering method. At this time, the microlens 209 is covered with the microlens passivation layer 200 and thus, the microlens 209 does not suffer from any damage created by the sputtering method. Furthermore, when the adhesive layer and the seed layer are subjected to the blanket etch-back process after forming the gold bump, there is also no damage to the microlens caused by this etching since the microlens is protected.

The present invention provides effects of preventing the microlens from being damaged and deformed in the course of a bump formation process and of removing easily the particles generated during the bump formation process. As a result of these effects, it is further possible to improve yields of the desired products and to prevent degradation of optical properties.

The present application contains subject matter related to the Korean patent application No. KR 2004-0019408, filed in the Korean Patent Office on Mar. 22, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An image sensor, comprising: a passivation layer formed on a substrate structure provided with a photodiode and other various device elements; a microlens formed on at least one planarization layer partially layered on the passivation layer; a microlens passivation layer having at least two materials selected from a group consisting of oxide, oxynitride and nitride formed on the microlens and serving a role in protecting the microlens from a bump formation process; a pad open region formed by etching the microlens passivation layer and the passivation layer; and a bump formed in the pad open region.

2. The image sensor of claim 1, wherein the microlens passivation layer is formed in a uniform thickness along a profile of the microlens.

3. The image sensor of claim 1, wherein the microlens passivation layer has a light transmittance and is made of an inorganic material.

4. The image sensor of claim 1, wherein the microlens passivation layer is formed with a thickness ranging from approximately 100 Å and to approximately 10,000 Å.

5. The image sensor of claim 1, wherein the image sensor is one of a complementary metal oxide semiconductor image sensor and a charged coupled device.

6. A CMOS image sensor, comprising: a passivation layer formed on a substrate structure provided with a photodiode and other various device elements; a microlens formed on at least one planarization layer partially layered on the passivation layer; a microlens passivation layer having at least two materials selected from a group consisting of oxide, oxynitride and nitride formed on the microlens and serving a role in protecting the microlens from a bump formation process; a pad open region formed by etching the microlens passivation layer and the passivation layer; and a bump formed in the pad open region.

7. The CMOS image sensor of claim 6, wherein the microlens passivation layer is formed in a uniform thickness along a profile of the microlens.

8. The CMOS image sensor of claim 6, wherein the microlens passivation layer has a light transmittance and is made of an inorganic material.

9. The CMOS image sensor of claim 6, wherein the microlens passivation layer is formed with a thickness ranging from approximately 100 Å and approximately 10,000 Å.

* * * * *